US012527066B2

(12) United States Patent
Li

(10) Patent No.: US 12,527,066 B2
(45) Date of Patent: Jan. 13, 2026

(54) GATE ISOLATION STRUCTURES AND METHODS OF FORMING THE SAME

(71) Applicant: Taiwan Semiconductor Manufacturing Company, Ltd., Hsin-Chu (TW)

(72) Inventor: Siao-Jing Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 385 days.

(21) Appl. No.: 18/344,400

(22) Filed: Jun. 29, 2023

(65) Prior Publication Data
US 2025/0006559 A1  Jan. 2, 2025

(51) Int. Cl.
*H10D 84/01*  (2025.01)
*H10D 30/01*  (2025.01)
(Continued)

(52) U.S. Cl.
CPC ....... *H10D 84/0153* (2025.01); *H10D 30/014* (2025.01); *H10D 30/024* (2025.01);
(Continued)

(58) Field of Classification Search
CPC ............... H10D 30/01; H10D 30/014; H10D 30/019–0198; H10D 30/024;
(Continued)

(56) References Cited

U.S. PATENT DOCUMENTS

| | | |
|---|---|---|
| 2019/0088650 A1* | 3/2019 | Tsai ................ H01L 21/32135 |
| 2019/0157136 A1 | 5/2019 | Zhou |
| 2022/0037209 A1 | 2/2022 | Chen |

FOREIGN PATENT DOCUMENTS

TW  201820629 A  6/2018

OTHER PUBLICATIONS

Chiang et al., "Methods for Forming Isolation Structures," U.S. Appl. No. 17/881,430, filed Aug. 4, 2022, Assignee: Taiwan Semiconductor Manufacturing Company, Ltd., 28 pages specification, 20 pages drawings.

* cited by examiner

*Primary Examiner* — Cheung Lee
(74) *Attorney, Agent, or Firm* — HAYNES AND BOONE, LLP

(57) ABSTRACT

Semiconductor structures and methods are provided. An exemplary method according to the present disclosure includes forming a first and a second fin-shaped active region over a substrate, the first and second fin-shaped active regions extending lengthwise along a first direction, forming a gate structure over channel regions of the first and second fin-shaped active regions, the gate structure extending lengthwise along a second direction substantially perpendicular to the first direction, forming a trench to separate the gate structure into two segments, the trench extending lengthwise along the first direction and being disposed between the first and second fin-shaped active regions, performing an etching process to enlarge an upper portion of the trench, and forming a gate isolation structure in the trench, and, in a cross-sectional view cut through both the first and second fin-shaped active regions and the gate structure, the gate isolation structure is a T-shape structure.

20 Claims, 17 Drawing Sheets

(51) Int. Cl.
   *H10D 30/43*     (2025.01)
   *H10D 30/62*     (2025.01)
   *H10D 30/67*     (2025.01)
   *H10D 62/10*     (2025.01)
   *H10D 64/01*     (2025.01)
   *H10D 84/03*     (2025.01)
   *H10D 84/83*     (2025.01)

(52) U.S. Cl.
   CPC ......... *H10D 30/43* (2025.01); *H10D 30/6211* (2025.01); *H10D 30/6735* (2025.01); *H10D 30/6757* (2025.01); *H10D 62/121* (2025.01); *H10D 64/017* (2025.01); *H10D 84/0128* (2025.01); *H10D 84/0151* (2025.01); *H10D 84/0158* (2025.01); *H10D 84/038* (2025.01); *H10D 84/834* (2025.01)

(58) Field of Classification Search
   CPC ................ H10D 30/43; H10D 30/435; H10D 30/501–509; H10D 30/62; H10D 30/6211; H10D 30/6735; H10D 30/6755; H10D 30/674; H10D 30/6757; H10D 62/121; H10D 64/017; H10D 84/01; H10D 84/0128; H10D 84/0151; H10D 84/0153; H10D 84/0158; H10D 84/02; H10D 84/032; H10D 84/035; H10D 84/038; H10D 84/05; H10D 84/07
   See application file for complete search history.

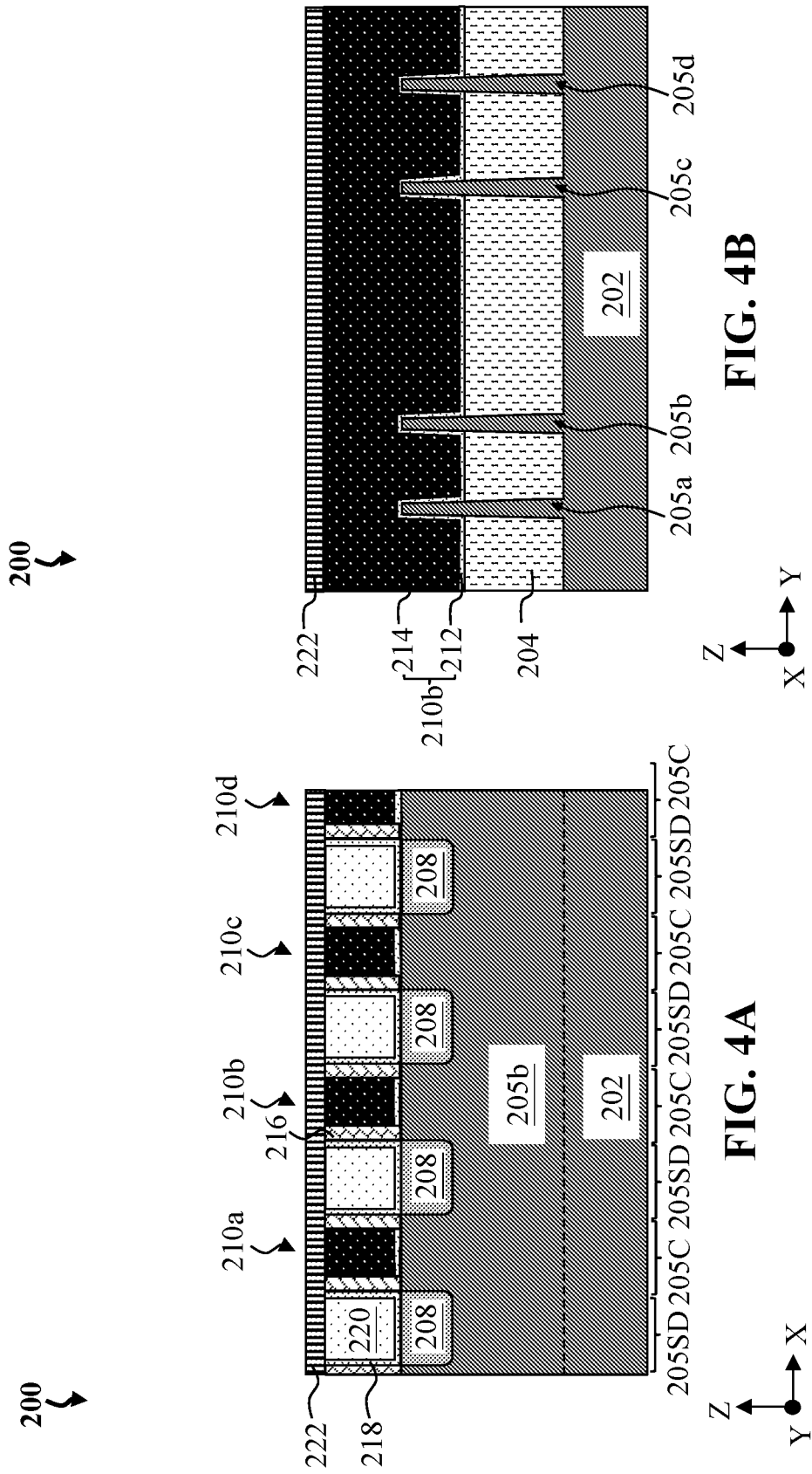

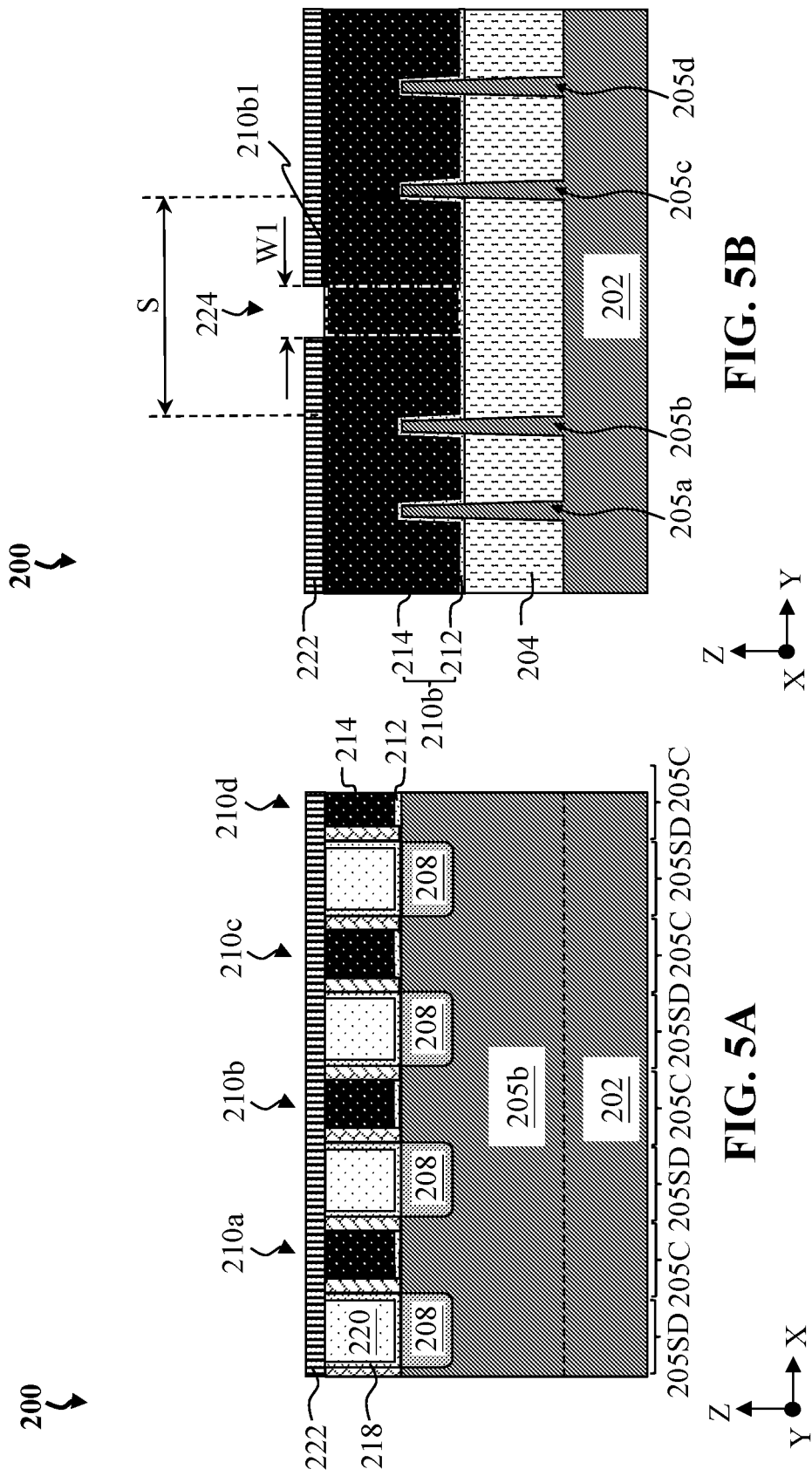

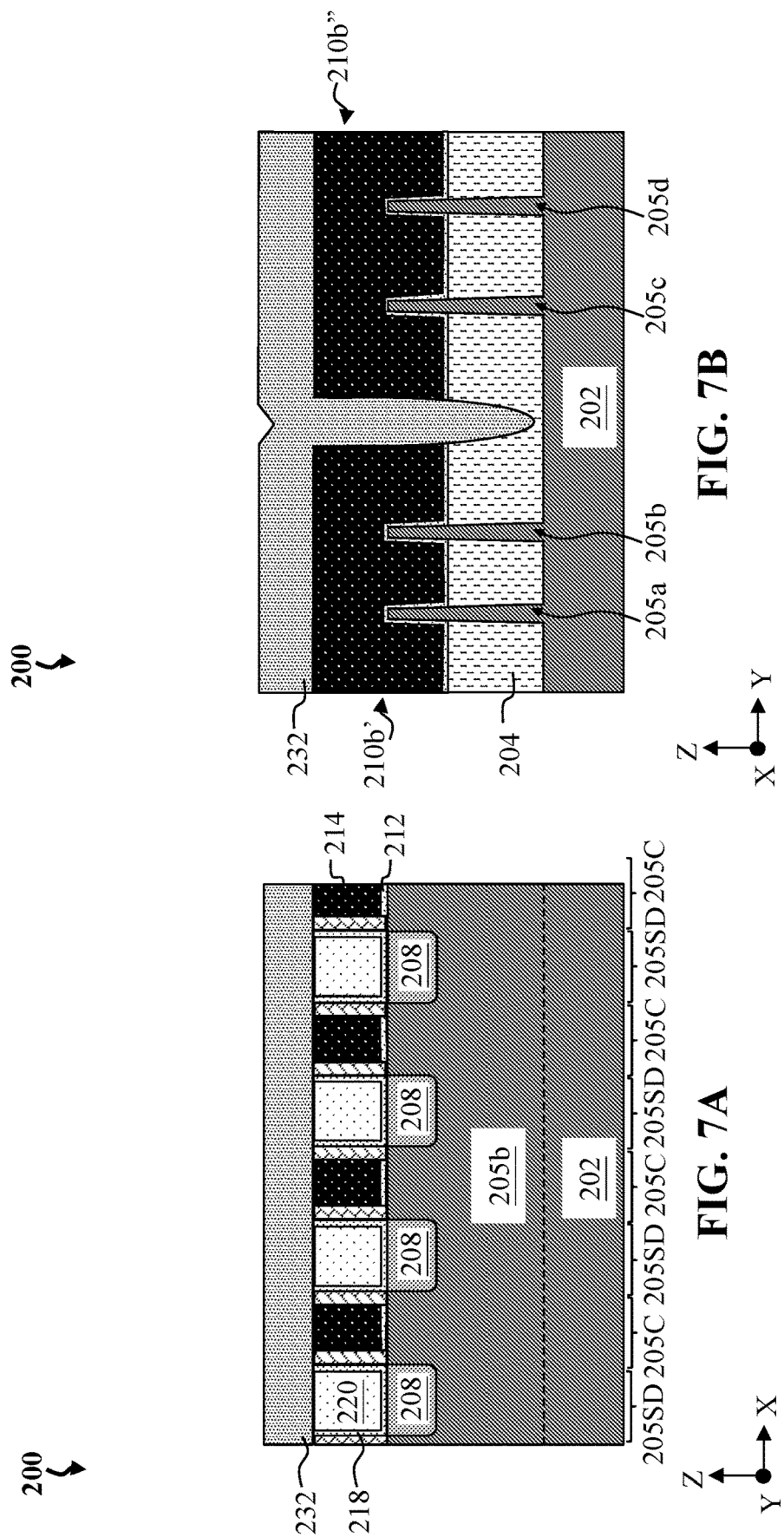

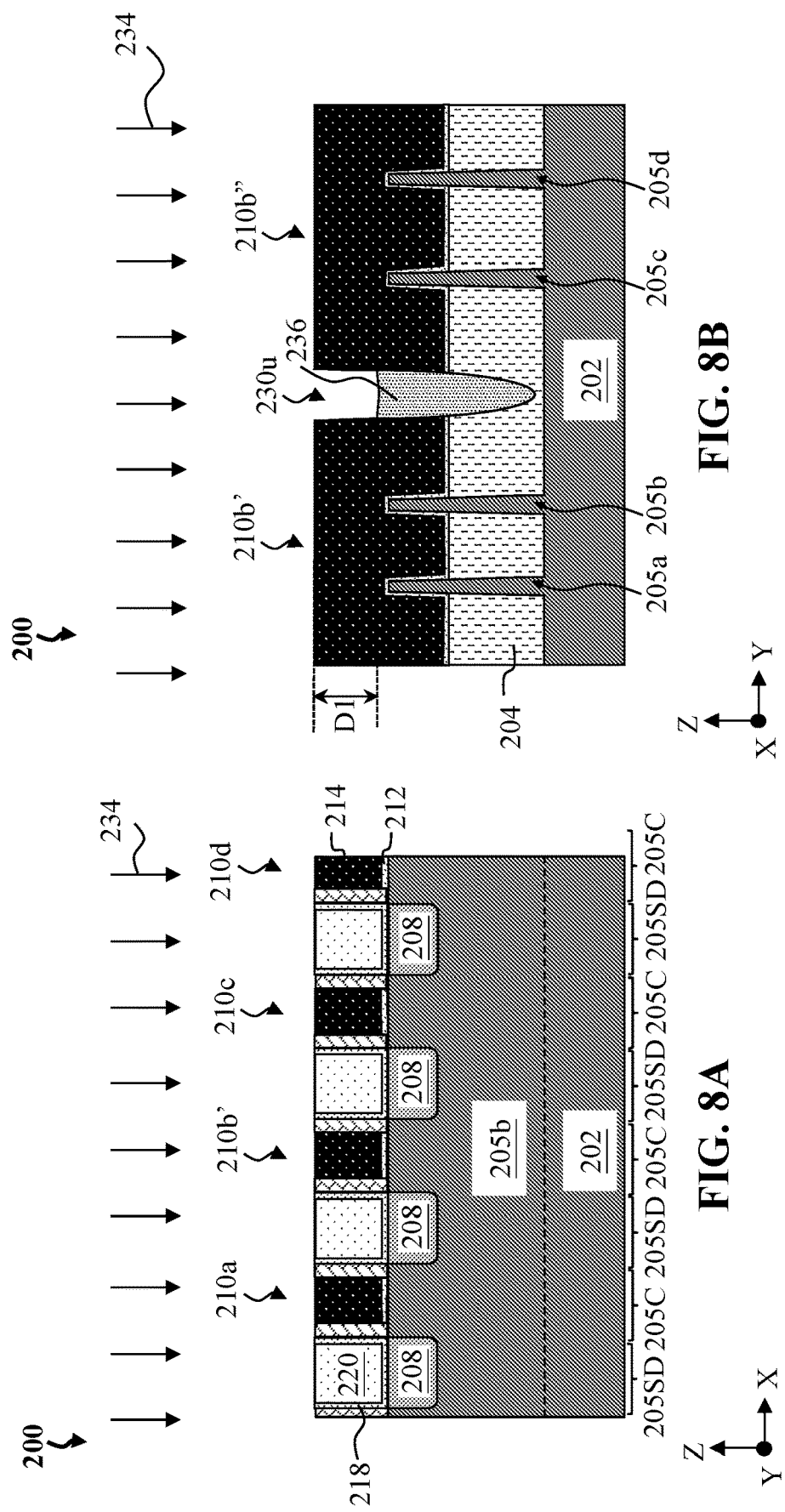

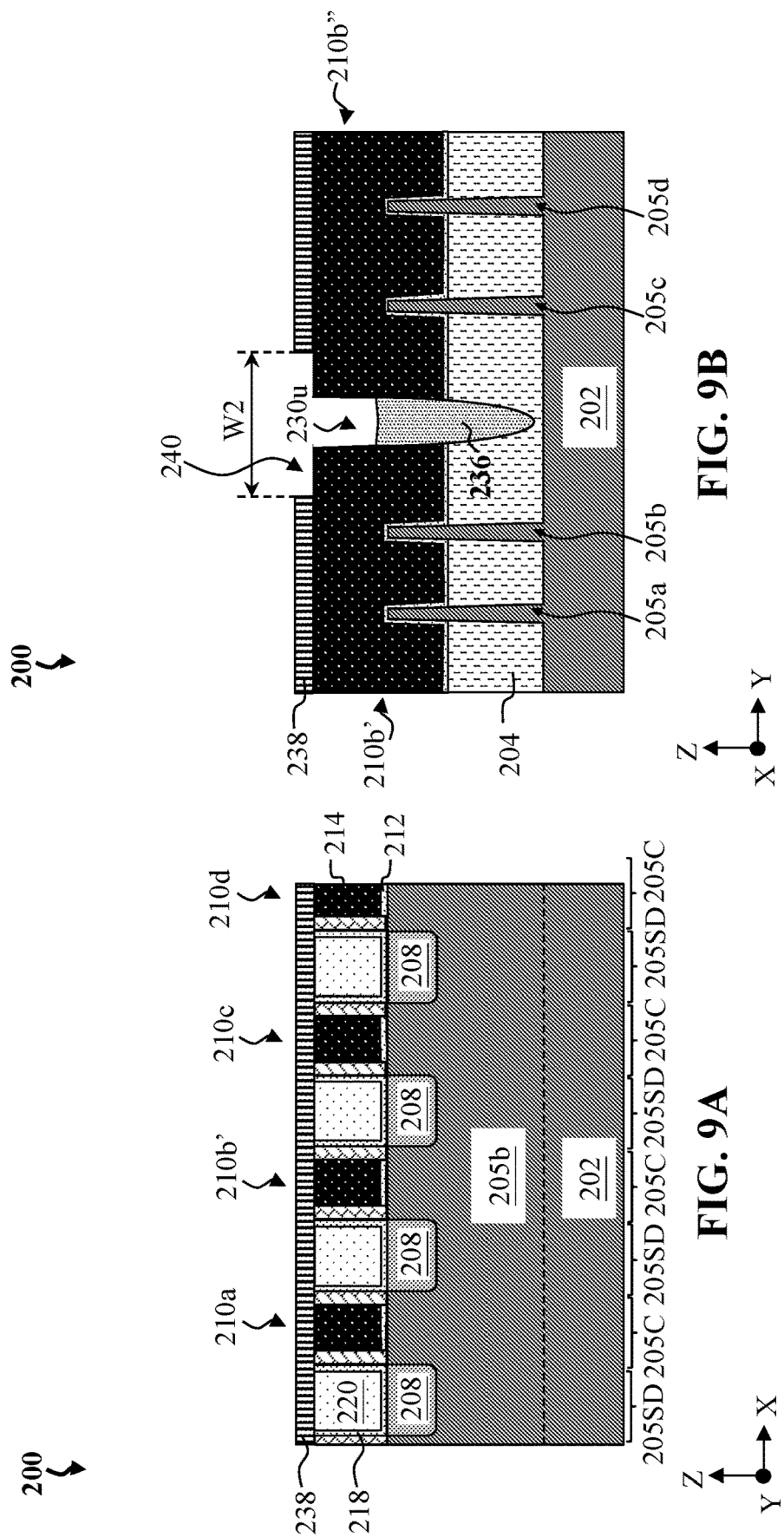

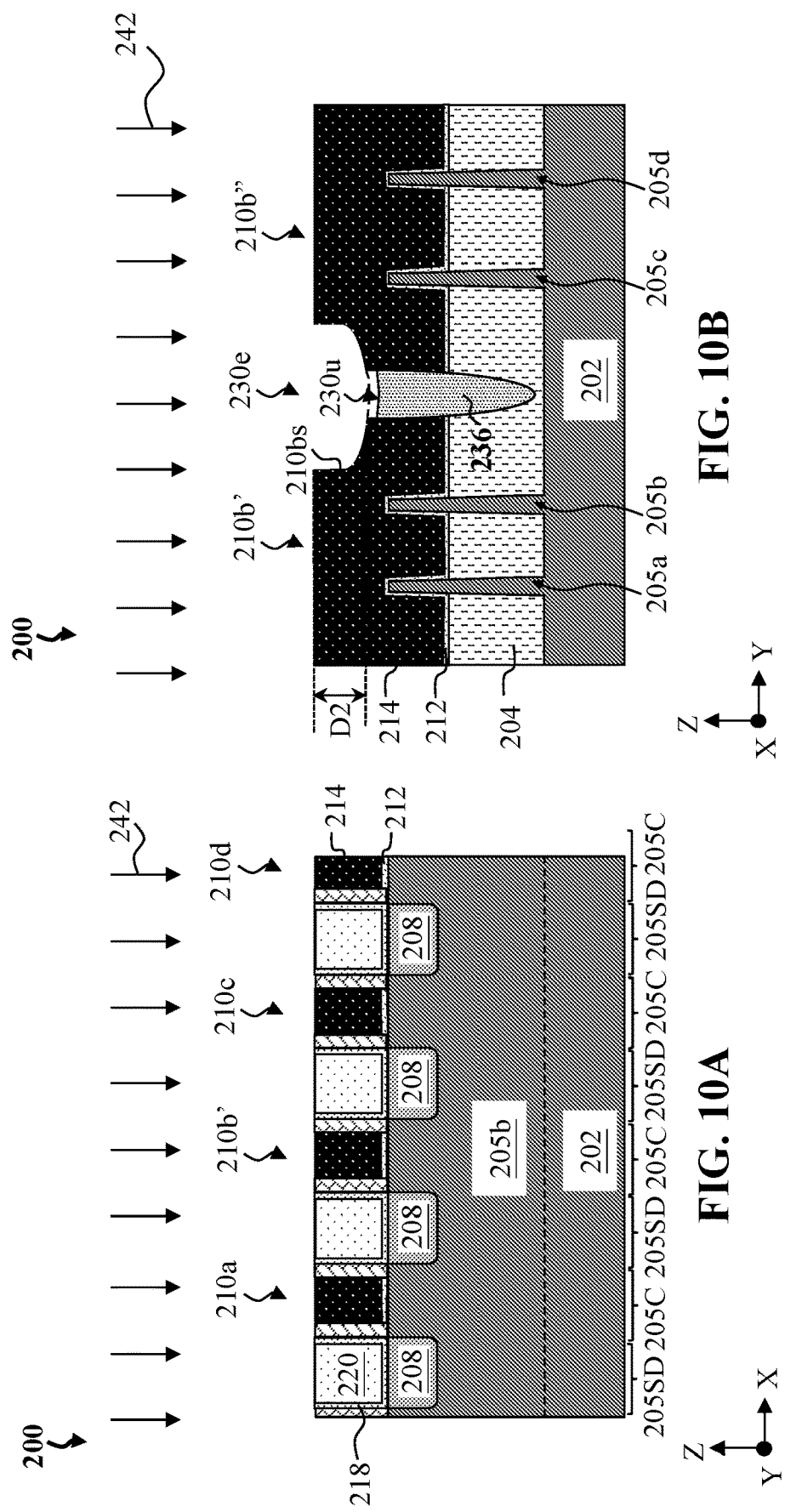

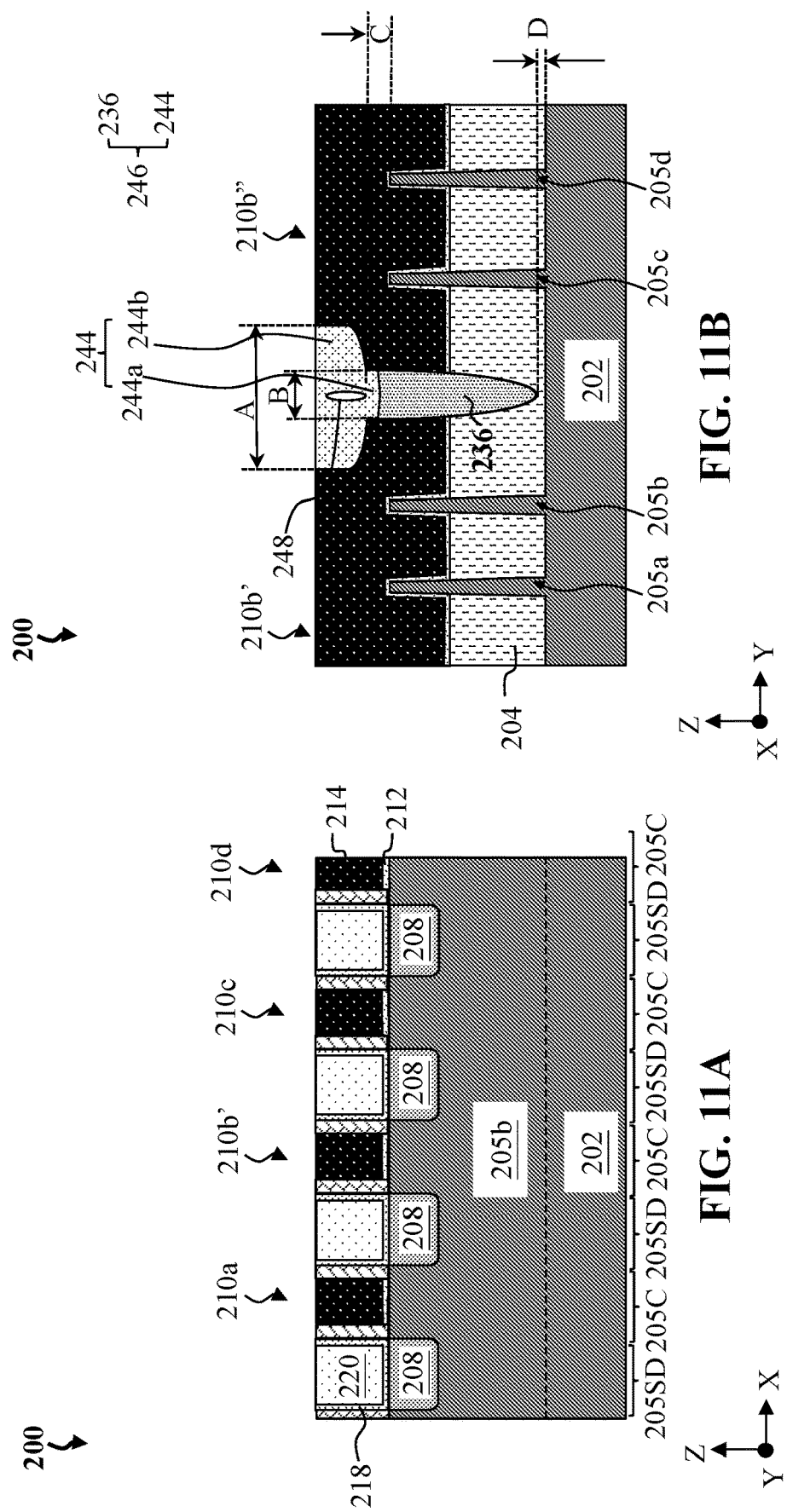

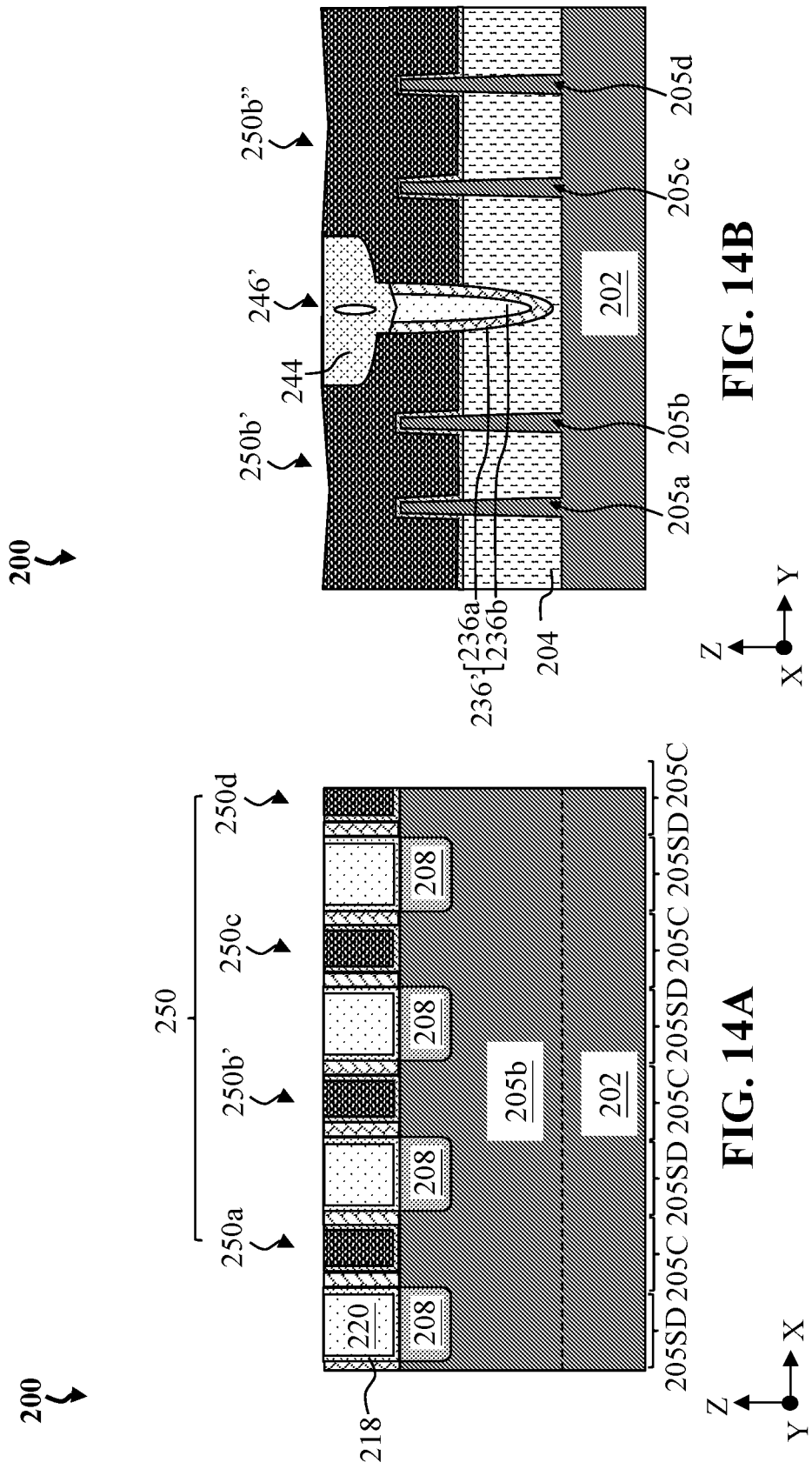

GATE ISOLATION STRUCTURES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. As semiconductor devices continue to scale down, challenges arise in achieving desired density and performance. For example, a gate isolation structure may be formed to cut a gate structure into segments, and when separation distances between two adjacent active regions are reduced to meet design requirements of smaller technology nodes, the spacing for forming the gate isolation structure is reduced, leading to a higher parasitic capacitance between the two segments of the gate structure cut by the gate isolation structure. The higher parasitic capacitance disadvantageously impacts the overall performance of an IC device. In some examples, the higher parasitic capacitance may lead to lower device speed (e.g., RC delays). Thus, while existing gate isolation structures are generally adequate in isolating gate structure segments, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, and 13A illustrate fragmentary cross-sectional views of the workpiece taken along line A-A as shown in FIG. 2 during various fabrication stages in the method of FIG. 1, according to various aspects of the present disclosure.

FIGS. 3B, 4B, 5B. 6B, 7B, 8B, 9B, 10B, 11B, and 13B illustrate fragmentary cross-sectional views of the workpiece taken along line B-B as shown in FIG. 2 during various fabrication stages in the method of FIG. 1, according to various aspects of the present disclosure.

FIGS. 14A and 14B illustrate fragmentary cross-sectional views of an alternative workpiece, according to various aspects of the present disclosure.

DETAILED DESCRIPTION

Figure 1:
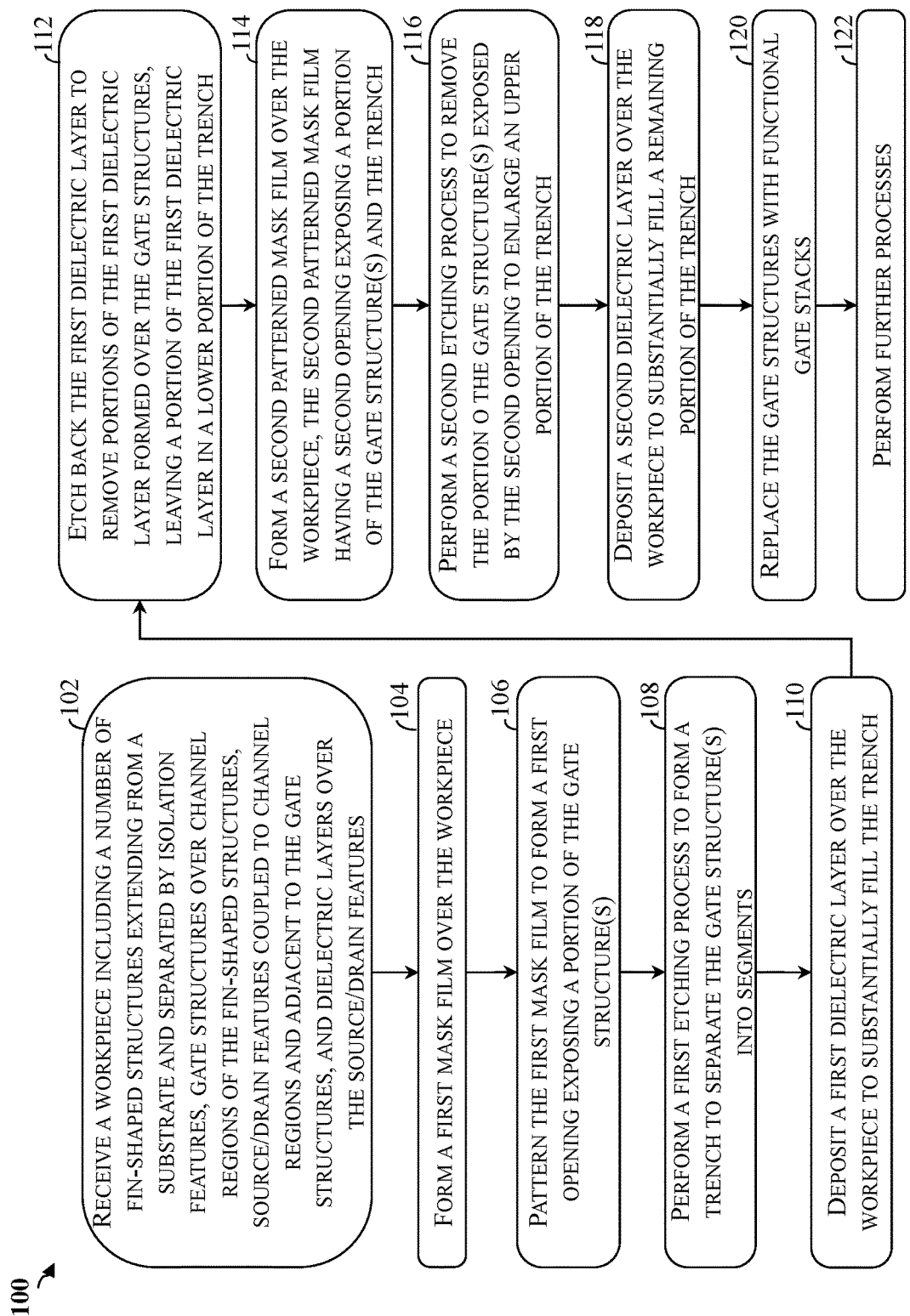
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

The present disclosure is directed to methods of forming a T-shaped gate isolation structure and associated semiconductor structures. In some embodiments, an exemplary method includes forming a trench to cut a gate structure into two segments, forming a first dielectric layer to substantially fill the trench, etching back the first dielectric layer to release an upper portion of the trench, performing an etching process to enlarge at least a part of the upper portion of the trench, and forming a second dielectric layer in the enlarged upper portion of the trench. As a result, in a cross-sectional view, the gate isolation structure resembles a T shape. By forming the T-shaped gate isolation structure, the parasitic capacitance between two segments of the gate structure divided by the T-shaped gate isolation structure may be advantageously reduced, and the device speed may be increased. In some other implementations, different parts of T-shaped gate isolation structure may be formed with dielectric materials having different dielectric constants, and the device speed may be modulated to fulfill different device speed requirements.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2, 3A-11A, 3B-11B, 12, 13A-14A, 13B-14B, 15, 16 and 17, which are fragmentary cross-sectional views or top views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor structure 200 upon conclusion of the fabrication processes, the workpiece 200 may be referred to as the semiconductor structure 200 as the context requires. For avoidance of doubts, the X, Y and Z directions in the figures are perpendicular to one another and are used consistently. Throughout the present disclosure, like reference numerals denote like features unless otherwise excepted.

Referring to FIGS. 1, 2 and 3A-3B, method 100 includes a block 102 where a workpiece 200 is received. The workpiece 200 includes a substrate 202 (shown in FIGS. 3A-3B). In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. The substrate 202 can include various doped regions (not shown) configured according to design requirements of semiconductor structure 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants. An ion implantation process, a diffusion process, and/or other suitable doping process can be performed to form the various doped regions.

Figure 2:
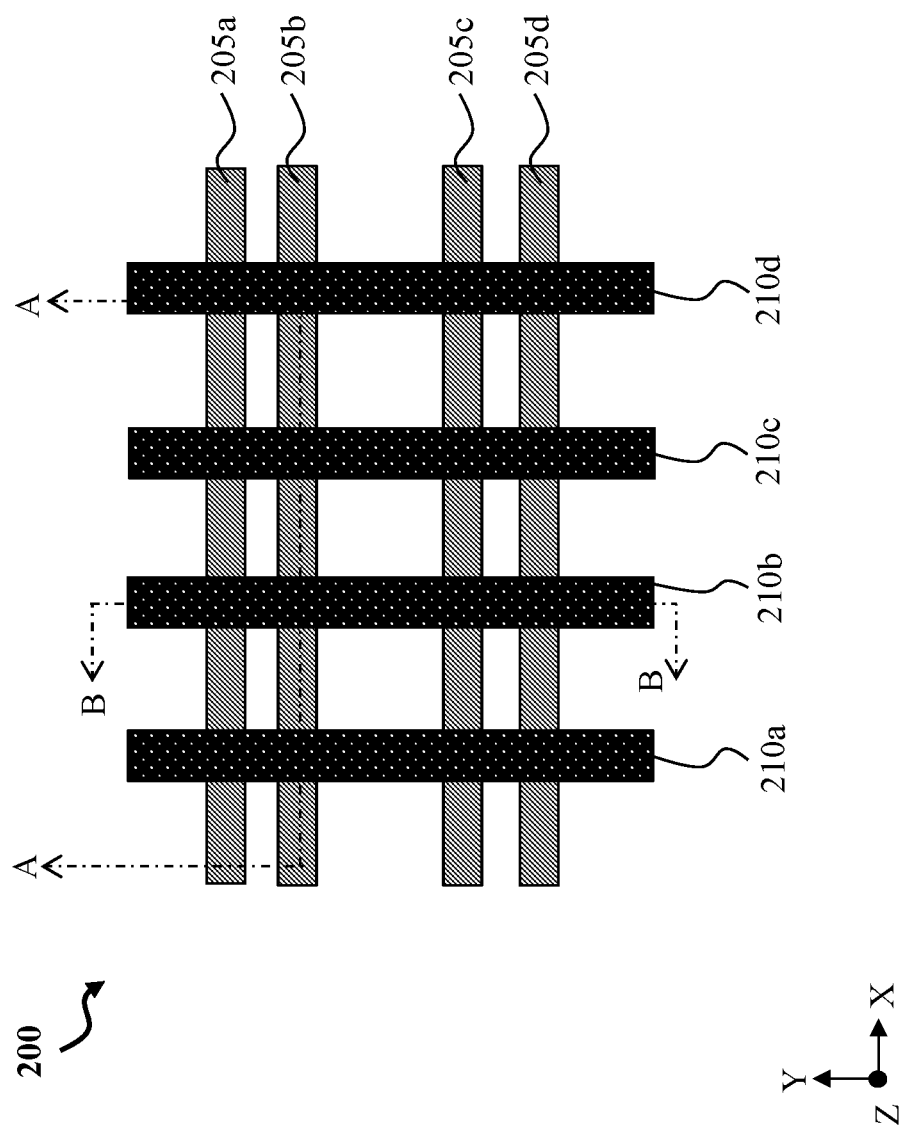
FIG. 2 illustrates a fragmentary top view of an exemplary workpiece to undergo various stages of operations in the methods of FIG. 1, according to various aspects of the present disclosure.

The workpiece 200 also includes multiple fin-shaped structures/fin-shaped active regions (such as fin-shaped structures 205a, 205b, 205c, 205d) disposed on the substrate 202. The number of fin-shaped structures 205a-205d shown in FIG. 2 is just an example. The workpiece 200 may include any suitable number of fin-shaped structures. In some embodiments, the fin-shaped structures 205a-205d may be formed from patterning a top portion of the substrate 202. Each of the fin-shaped structures 205a-205d vertically protrudes along the Z direction, extends in an elongated manner along the X direction, and are separated from one another along the Y direction, as shown in FIG. 2. In the present embodiments, the fin-shaped structures 205a-205d may include a uniform semiconductor composition along the Z axis and a final structure of the workpiece 200 includes FinFETs. In some embodiments, the fin-shaped active regions 205a and 205b will serve as a dual-fin active region for a dual-fin device (e.g., an n-type dual-fin device), and the fin-shaped active regions 205c and 205d will serve as a dual-fin active region for another dual-fin device (e.g., a p-type dual-fin device). The present disclosure is also applicable to single-fin devices or other multi-fin devices.

Figures 3A, 3B:
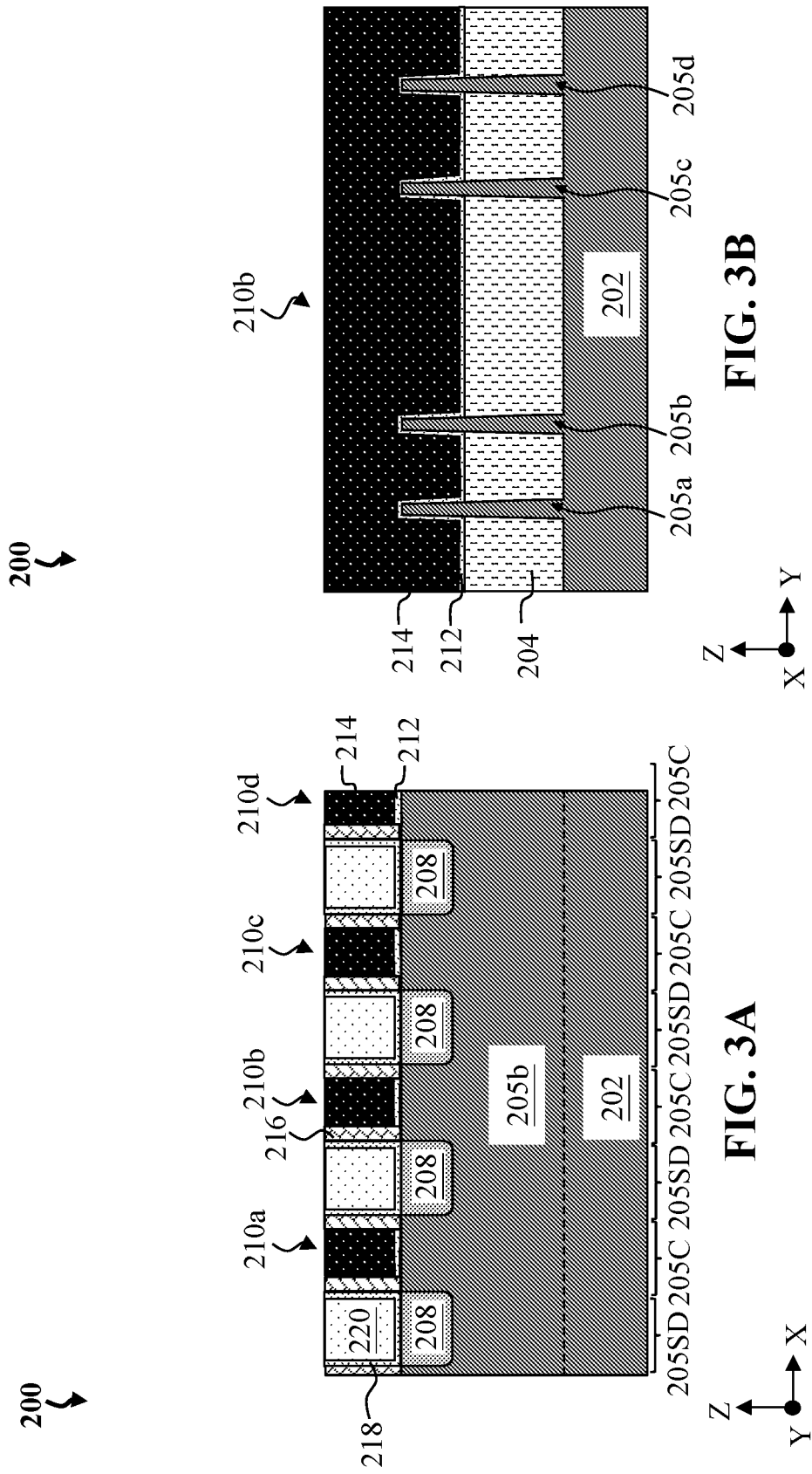

As represented in FIG. 3A, each of the fin-shaped structures 205a-205d includes channel regions 205C and source/drain regions 205SD. Each channel region 205C underlies a gate structure while the source/drain region 205SD is not overlapped by a gate structure. As will be described further below, source/drain features 208 are to be formed in and/or over the source/drain region 205SD. Source/drain feature(s) 208 may refer to a source or a drain, individually or collectively dependent upon the context.

The workpiece 200 also includes a number of isolation features (such as isolation features 204 shown in FIG. 3B) formed around the fin-shaped structures 205a-205b to isolate two adjacent fin-shaped structures. The isolation features 204 may also be referred to as shallow trench isolation (STI) features 204. In some embodiments, the STI features 204 may include silicon oxide, silicon oxynitride, fluorine-doped silicate glass (FSG), a low-k dielectric, combinations thereof, and/or other suitable materials.

As represented in FIGS. 2 and 3A, the workpiece 200 also includes source/drain features 208 formed in and/or over source/drain regions 205SD and coupled to the channel regions 205C. Depending on the conductivity type of the to-be-formed transistor(s), the source/drain features 208 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. Each of the source/drain features 208 may span over a single fin-shaped structure or span over two fin-shaped structures. For example, a source/drain feature 208 of a dual-fin device may span over the fin-shaped structures 205a-205b or span over the fin-shaped structures 205c-205d.

Still referring to FIGS. 2 and 3A-3B, the workpiece 200 includes dummy gate structures (e.g., dummy gate structures 210a, 210b, 210c, 210d) disposed over channel regions 205C of the fin-shaped structures 205a-205d. In the embodiments represented in FIG. 2 and FIG. 3B, the dummy gate structure 210b is formed directly over channel regions 205C of the fin-shaped structures 205a-205d. Each of the dummy gate structures 210a-210d includes a dummy gate dielectric layer 212 and a dummy gate electrode 214 over the dummy gate dielectric layer 212. In some embodiments, the dummy gate dielectric layer 212 may include silicon oxide, and the dummy gate electrode 214 may include polycrystalline silicon. In this embodiment, a gate replacement process (or gate-last process) is adopted where one or more of the dummy gate structures 210a, 210b, 210c, 210d serve as placeholders for functional gate stacks. Other processes and configuration are possible.

Sidewalls of the dummy gate structures 210a-210d are lined with gate spacers 216. In an example process, a gate spacer layer may be deposited conformally over the workpiece 200, including over top surfaces and sidewalls of the dummy gate structures 210a-210d. The term "conformally" may be used herein for ease of description of a layer having substantially uniform thickness over various regions. The gate spacer layer may be a single-layer structure or a multi-layer structure. The gate spacer layer may include silicon nitride, silicon oxycarbonitride, silicon carbonitride, silicon oxide, silicon oxycarbide, silicon carbide, silicon oxynitride, and/or combinations thereof and may be deposited using processes such as, chemical vapor deposition (CVD), flowable chemical vapor deposition (FCVD), atomic layer deposition (ALD), physical vapor deposition (PVD), or other suitable process. The gate spacer layer may be then etched back to form the gate spacers 216 extending along the sidewall surfaces of the dummy gate structures 210a-210d. Dielectric materials for the gate spacer layer may be selected to allow selective removal of the dummy gate structures 210a-210d without substantially damaging the gate spacers 216.

Still referring to FIG. 3A, the workpiece 200 also includes a contact etch stop layer (CESL) 218 and an interlayer dielectric (ILD) layer 220 deposited over the source/drain features 208. The CESL 218 is configured to protect the various underlying components during subsequent fabrication processes and may include silicon nitride, silicon oxynitride, and/or other suitable materials and may be formed by atomic layer deposition (ALD), chemical vapor deposition (CVD), plasma-enhanced chemical vapor deposition (PECVD) process and/or other suitable deposition or oxidation processes. As shown in FIG. 3A, the CESL 218 may be deposited on top surfaces of the source/drain features 208 and sidewalls of the gate spacers 216. The ILD layer 220 is deposited by a CVD process, a PECVD process or other suitable deposition technique over the workpiece 200 after the deposition of the CESL 218. The ILD layer 220 may include silicon oxide, a low-k dielectric material, tetraethyl orthosilicate (TEOS), doped silicon oxide (e.g., borophosphosilicate glass (BPSG), fluorosilicate glass (FSG), phosphosilicate (PSG)), other suitable dielectric materials, or combinations thereof. One or more planarization processes (e.g., chemical mechanical polishing (CMP)) may be performed to planarize the top surface of the workpiece 200 after the deposition of the ILD layer 220. The planarization processes may also remove gate-top hard mask layers (not depicted) formed over the dummy gate electrodes 214 of the dummy gate structure 210a-210d.

Referring to FIGS. 1 and 4A-4B, method 100 includes a block 104 where a mask film 222 is formed over the workpiece 200. The mask film 222 may be a single-layer structure or a multi-layer structure. The mask film 222 may include any suitable materials, as long as its composition is different from those of the dummy gate structures 210a-210d and the gate spacers 216 to allow selective removal by an etching process.

Referring to FIGS. 1 and 5A-5B, method 100 includes a block 106 where the mask film 222 is patterned to form a first opening 224 exposing a portion of the dummy gate structure 210b. In some implementations, a combination of lithography and the etching processes are performed to form the patterned mask film 222. For example, a photoresist layer (not shown) is formed on the workpiece 200 by, for example, spin coating. An exposure process is then performed using a mask. A developing process may be then performed to remove the exposed portion of the photoresist layer, thereby forming the patterned mask film 222. In some other embodiments, the patterned mask film may include a patterned hard mask layer. The patterned hard mask layer may be patterned by using the patterned photoresist layer as an etch mask. In the illustrated embodiments, the patterned mask film 222 exposes a portion 210b1 of the dummy gate structure 210b that is disposed between the fin-shaped structure 205b and the fin-shaped structure 205c. The portion 210b1 of the dummy gate structure 210b is disposed on the isolation feature 204. The fin-shaped structure 205b is spaced apart from the fin-shaped structure 205c by a spacing S. The first opening 224 spans a width W1 along the Y direction. The width W1 is less than the spacing S.

Figures 6A, 6B:
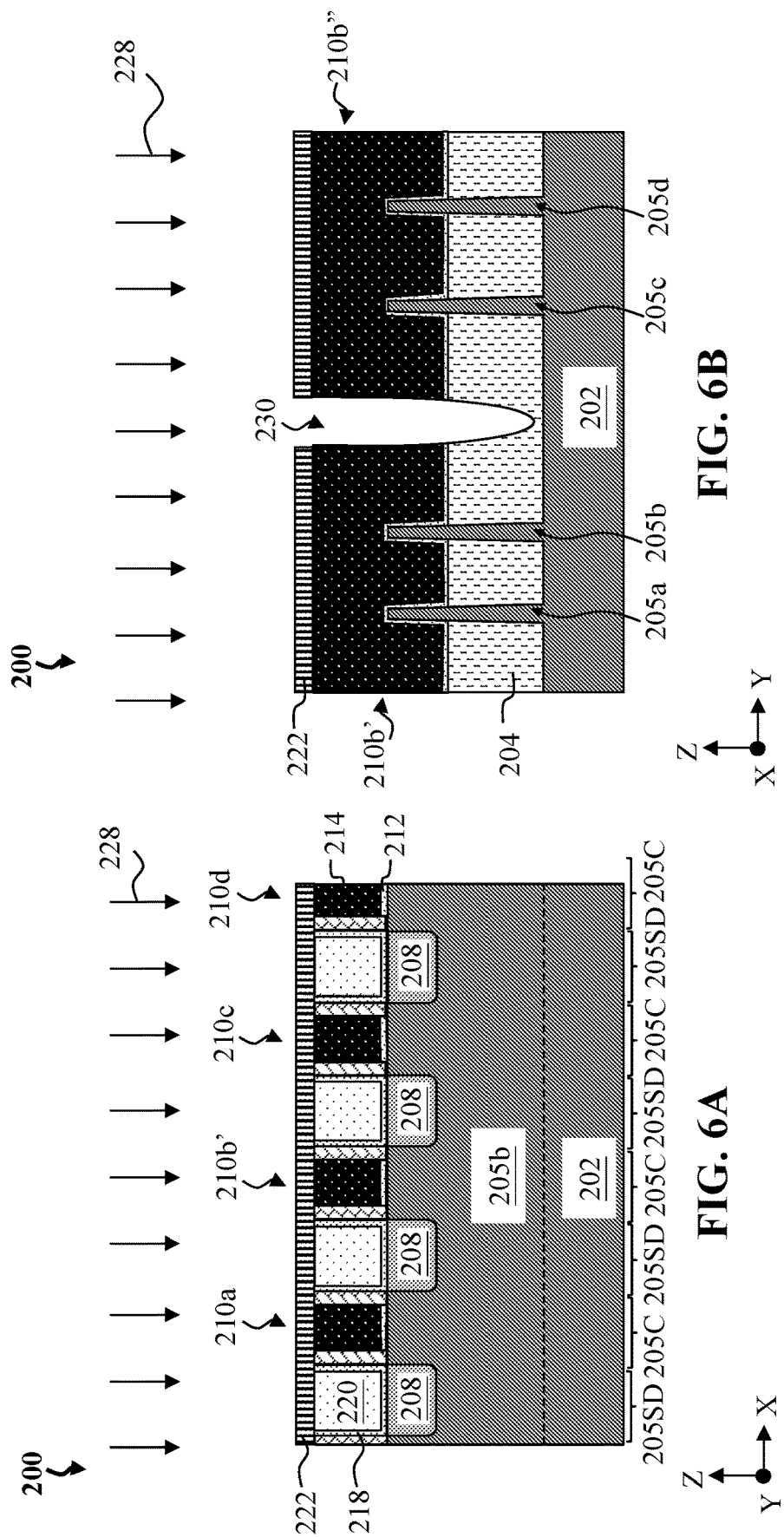

Referring to FIGS. 1 and 6A-6B, method 100 includes a block 108 where an etching process 228 is performed to form a trench 230 to divide the dummy gate structure 210b into segments 210b' and 210b". After forming the patterned mask film 222 that includes the first opening 224, while using the patterned mask film 222 as an etch mask, the etching process 228 is performed to the workpiece 200 to form the trench 230. The etching process 228 may include a dry etching process, a wet etching process, or another other suitable etching process. In the present embodiment, the etching process 228 is a dry etching process that utilizes a chlorine-containing gas (e.g., $Cl_2$), a fluorine-containing gas (e.g., $CF_4$ and/or $C_2F_6$), or other suitable gases and/or plasmas, and/or combinations thereof. After the performing of the etching process 228, at least sidewall surfaces of the segments 210b' and 210b" of the dummy gate structure 210b exposed in the trench 230 are substantially vertical. The portion of the trench 230 that extends through the dummy gate structure 210b spans a width that is substantially equal to the width W1. In embodiments represented in FIG. 6B, the etching process 228 removes the portion 210b1 of the dummy gate structure 210b and a portion of the STI feature 204 disposed directly under the portion 210b1 of the dummy gate structure 210b. That is, the trench 230 extends through the dummy gate structure 210b and extends into the STI feature 204. Due to the high aspect ratio, the portion of the trench 230 that extends into the STI feature 204 may span a width that is less than the width W1. In some other implementations, the etching process 228 may also etch a portion of the substrate 202. In other words, the trench 230 may extend through the dummy gate structure 210b and the STI feature 204, and further extend into the substrate 202.

The trench 230 separates a remaining portion of the dummy gate structure 210b into two segments 210b' and 210b". The two segments 210b' and 210b" of the dummy gate structure 210b may be referred to as gate structures 210b' and 210b", respectively. In embodiments represented in FIG. 6B, the trench 230 is disposed between the fin-shaped structure 205b and the fin-shaped structure 205c, the dummy gate structure 210b' wraps over the fin-shaped structures 205a and 205b, and the dummy gate structure 210b" wraps over the fin-shaped structures 205c and 205d. It is understood that the workpiece 200 may include fin-shaped structures having different configurations, the trench 230 may be formed between any two adjacent fin-shaped structures, and the dummy gate structure 210b'/210b" may wrap over any suitable number (e.g., 1, 3, 4, or more) of the fin-shaped structures. Although not shown, from a top view of the workpiece 200, the trench 230 extends lengthwise along the X direction and may further separate the dummy gate structures 210a, 210c, and 210d. The patterned mask film 222 may be selectively removed after the formation of the trench 230.

Referring to FIGS. 1 and 7A-7B, method 100 includes a block 110 where a first dielectric layer 232 is deposited over the workpiece 200 to substantially fill the trench 230. The first dielectric layer 232 may include a low-k dielectric material or a high-k dielectric material. In some embodiments, the first dielectric layer 232 may include silicon oxide, silicon nitride, silicon carbide, silicon oxynitride, silicon oxycarbide, silicon carbonitride, a low-k dielectric material, other suitable materials, or combinations thereof, and may be deposited by CVD, PECVD, flowable CVD, PVD, ALD, other suitable methods, or combinations thereof. In an embodiment, the first dielectric layer 232 is formed of silicon oxide deposited by FCVD. In another embodiment, the first dielectric layer 232 is formed of silicon nitride, and a ALD process is first performed to form a first silicon nitride layer at the bottom of the trench 230 and a FCVD process is then followed to form a second silicon nitride layer over the first silicon nitride layer. Since the first and second silicon nitride layers are formed by different deposition processes, there may be an interface between the first silicon nitride layer and the second silicon nitride layer. An annealing process may be performed after the formation of the first dielectric layer 232. As depicted in FIG. 7B, the top surface of the first dielectric layer 232 may include a concave surface due to the exist of the trench 230. More specifically, a portion of the top surface of the first dielectric layer 232 directly over the trench 230 may be a concave surface and below a remaining portion of the top surface of the first dielectric layer 232.

Referring to FIGS. 1 and 8A-8B, method 100 includes a block 112 where the first dielectric layer 232 is selectively etched back. After the deposition of the first dielectric layer 232, the first dielectric layer 232 is etched back by an etching process 234. The etching process 234 may include a dry etching process, a wet etching process, and/or a combination thereof. In the present embodiment, the etching process 234 is a dry etching process that utilizes a fluorine-containing gas (e.g., $SiF_4$ and/or HF) or other suitable gases. In an embodiment, the etching process 234 implements $SiF_4$, and the etching process 228 implements $Cl_2$. In the present embodiments, the portion of the first dielectric layer 232 formed on the gate structures 210b' and 210b" and a portion of the first dielectric layer 232 formed in an upper portion 230u of the trench 230 are selectively removed, leaving a portion 236 of the first dielectric layer 232 formed in the bottom portion of trench 230. The portion 236 of the first dielectric layer 232 in the bottom portion of trench 230 may be referred to as the first dielectric layer 236. The removal of the portion of the first dielectric layer 232 formed in the trench 230 releases the upper portion 230u of the trench 230, as illustrated in FIG. 8B. In an embodiment, a top surface of the first dielectric layer 236 is above a top surface of the isolation feature 204. The upper portion 230u of the trench 230 has a depth D1 along the Z direction.

Referring to FIGS. 1 and 9A-9B, method 100 includes a block 114 where a patterned mask film 238 is formed over the workpiece 200. The formation of the patterned mask film 238 is similar to the formation of the patterned mask film 222 (shown in FIG. 5B) and repeated description is omitted for reason of simplicity. The patterned mask film 238 includes an opening 240 configured to facilitate the removal of portions of the gate structures 210b' and 210b". In the present embodiments, the opening 240 spans a width W2 along the Y direction, the width W2 is greater than the width W1. As illustrated in FIG. 9B, the opening 240 exposes the upper portion 230u of the trench 230, and further exposes a portion of the dummy gate structure 210b' and a portion of the dummy gate structure 210b" adjacent to the upper portion 230u of the trench 230.

Referring to FIGS. 1 and 10A-10B, method 100 includes a block 116 where an etching process 242 is performed to recess the portions of the gate structures 212b' and 212b" not covered by the patterned mask film 238 to enlarge at least a part of the upper portion 230u of the trench 230. While using the patterned mask film 238 as an etch mask, the etching process 242 is performed to recess the portion of the gate structures 212b' and 212b not covered by the patterned mask film 222. More specifically, the etching process 242 is performed to selectively recess the dummy gate electrode 214 of the gate structures 212b' and 212b". The performing of the etching process 242 enlarges at least a part of the upper portion 230u of the trench 230. The enlarged part of the upper portion 230u of the trench 230 may be referred to as the trench 230e. In the present embodiments, the trench 230e has a depth D2 along the Z direction, and the depth D2 is less than the depth D1. That is, after the performing of the etching process 242, a portion of the gate structures 212b' and 212b" adjacent to a lower part of the upper portion 230u of the trench 230 is not substantially recessed. In some other implementations, the depth D2 may be substantially equal to the depth D1. The etching process 242 may a dry etching process, a wet etching process, and/or a combination thereof. In the present embodiment, the etching process 234 is a wet etching process that utilizes a wet etchant solution that includes, for example, $H_3PO_4$. In some embodiments, a temperature of the wet etchant solution is higher than room temperature. After the performing of the wet etching process, as illustrated in FIG. 10B, the dummy gate structure 210b' has a surface 210bs exposed in the trench 230e and curved inward due to the performing of the wet etching process. Similarly, the dummy gate structure 210b" also has a surface that curves inward. The patterned mask film 238 may be selectively removed after the forming of the trench 230e.

Referring to FIGS. 1, 11A-11B, and 12, method 100 includes a block 118 where a second dielectric layer 244 is deposited over the first dielectric layer 236 to substantially fill the trench 230e and a remaining part of the upper portion 230u of the trench 230. In an example process, a dielectric material layer (not shown) is deposited over the workpiece 200 to substantially fill a rest of the of the upper portion 230u and the trench 230e. For example, the dielectric material layer may include silicon nitride, silicon oxycarbonitride, silicon carbonitride, silicon oxynitride, hafnium oxide, zirconium oxide, aluminum oxide, silicon oxide, doped silicon oxide, combinations thereof, or other suitable materials, and may be formed by any suitable method, including CVD, ALD, PVD, other methods, or combinations thereof. A planarization process (e.g., CMP) may be then performed to remove excess portion of the dielectric material layer that is formed directly over the gate structures 210b' and 210b". The portion of the dielectric material layer formed in the trench 230e and the rest of the upper portion 230u is referred to as a second dielectric layer 244. The second dielectric layer 244 tracks the shape of the trench 230e and the shape of the upper portion 230u. That is, the second dielectric layer 244 includes a first portion 244a formed in rest of the upper portion 230u and in direct contact with the first dielectric layer 236, and a second portion 244b formed in the trench 230c. Along the Y direction, the second portion 244b has a width A greater than a width B of the first portion 244a of the second dielectric layer 244. Since width A is greater than the width B, the distance between upper portions of the gate structures 210b' and 210b" is increased, thereby reducing a total parasitic capacitance of the workpiece 200. The width A is substantially equal to the width W2 (shown in FIG. 9B), and the width B is substantially equal to the width W1 (shown in FIG. 5B). In an embodiment, a ratio of the width A to the spacing S (shown in FIG. 5B) may be between about 0.4 and 0.8. If the ratio is greater than 0.8, the risk of damaging the fin-shaped structures 205b and 205c may be greatly increased due to, for example, the etching variation associated with the etching process 242 and/or overlay shift associated with the formation of the patterned mask film 238. If the ratio is less than 0.4, the resulted second dielectric layer 244 may not significantly affect the parasitic capacitance of the semiconductor structure and thus will not significantly affect the device speed. In an embodiment, the width B may be between about 10 nm and about 15 nm, and the width difference between the width A and the width B may be between about 3 nm and about 10 nm. A distance C between a bottommost point of the surface 210bs of the second portion 244b of the second dielectric layer 244 and a top surface of the fin-shaped structure 205c is between about-5 nm and about 5 nm. That is, the bottommost point of the surface 210bs may be above the top surface of the fin-shaped structure 205c, coplanar with the top surface of the fin-shaped structure 205c, or below the top surface of the fin-shaped structure 205c.

The first dielectric layer 236 and the second dielectric layer 244 may be collectively referred to as a gate isolation structure 246. In the present embodiments, due to the performing of the etching process 242 that enlarges at least a part of the upper portion of the trench 230, in the cross-sectional view depicted in FIG. 11B, a shape of the gate isolation structure 246 resembles a T shape. In the present embodiments, the gate isolation structure 246 includes a seam (void, or airgap) 248 formed in the second dielectric layer 244, and the first dielectric layer 236 may be free of any substantial seam/void. In the present embodiments, a distance D between the bottommost point of the first dielectric layer 236 and the bottom surface of the isolation feature 204 is between about-20 nm and about 20 nm. That is, the gate isolation structure 246 may extend into the isolation feature 204 without being extending into the substrate, may have a bottom surface coplanar with a bottom surface of the isolation feature 204, or may extend through the isolation feature 204 and further extend into the substrate 202.

In an embodiment, a composition of the second dielectric layer 244 is the same as a composition of the first dielectric layer 236. For example, both the first dielectric layer 236 and the second dielectric layer 244 are formed of silicon nitride. It is noted that, even if the first dielectric layer 236 and the second dielectric layer 244 may be formed of a same material, there is a physical interface between the first dielectric layer 236 and the second dielectric layer 244. In some other implementations, the composition of the second dielectric layer 244 is different from the composition of the first dielectric layer 236. For example, the second dielectric layer 244 may be formed of a low-K dielectric material, and the first dielectric layer 236 is formed of a high-K dielectric material.

Figure 12:
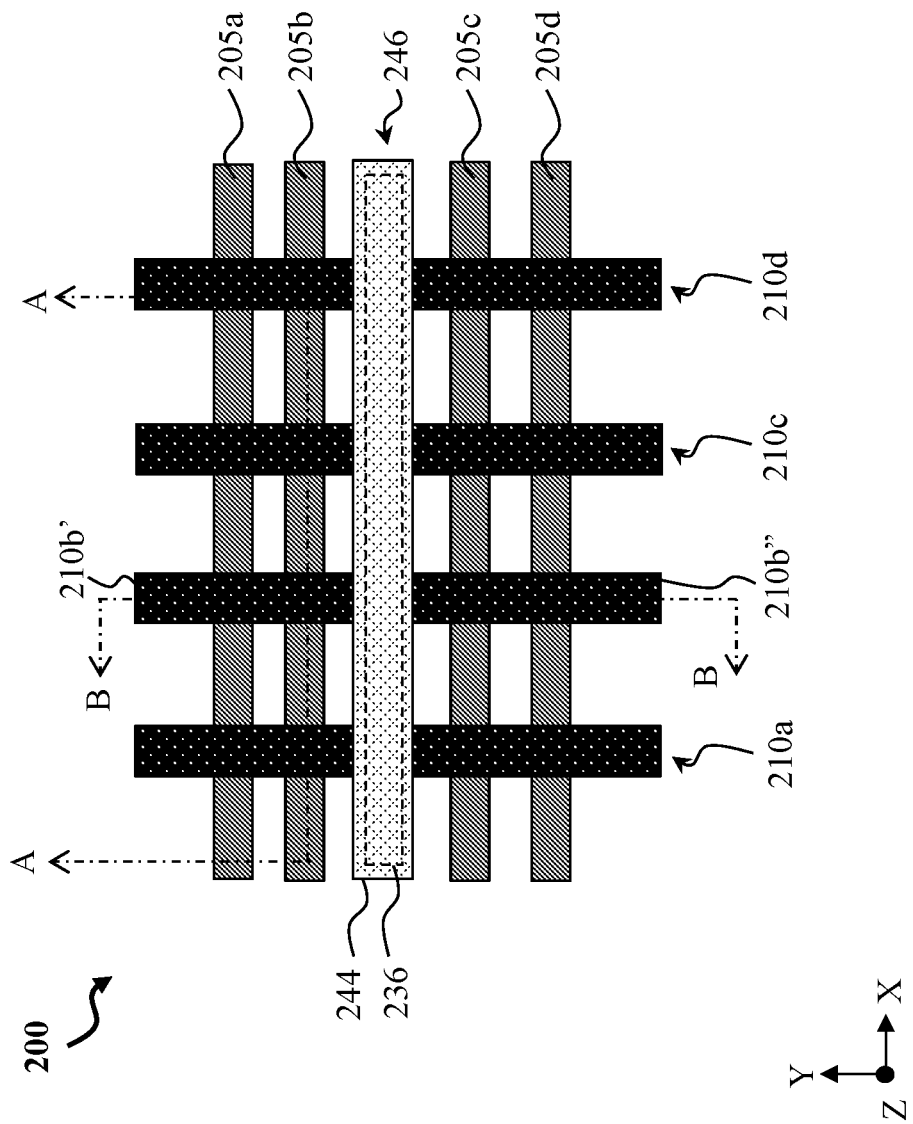
FIG. 12 illustrates a fragmentary top view of the exemplary workpiece shown in FIGS. 13A-13B, according to various embodiments of the present disclosure.

FIG. 12 depicts a fragmentary top view of the workpiece 200 shown in FIGS. 11A and 11B. In the illustrated embodiment, the gate isolation structure 246 extends lengthwise along the X direction and is disposed between the fin-shaped structures 205b and 205c. The gate isolation structure 246 may be formed in any suitable positions to fulfill different design requirements. For example, the gate isolation structure 246 may be configured to provide isolation between gate structures of two single-fin devices or provide isolation between gate structures of a single-fin device and a multi-fin (e.g., dual-fin) device. Besides dividing the dummy gate structure 210b into two electrically and physically isolated segments 210b' and 210b", the gate isolation structure 246 may further cut one or more of a rest of the gate structures. For example, as represented in FIG. 12, the gate isolation structure 246 also cuts each of the dummy gate structures 210a, 210c, and 210d into portions.

Figures 13A, 13B:
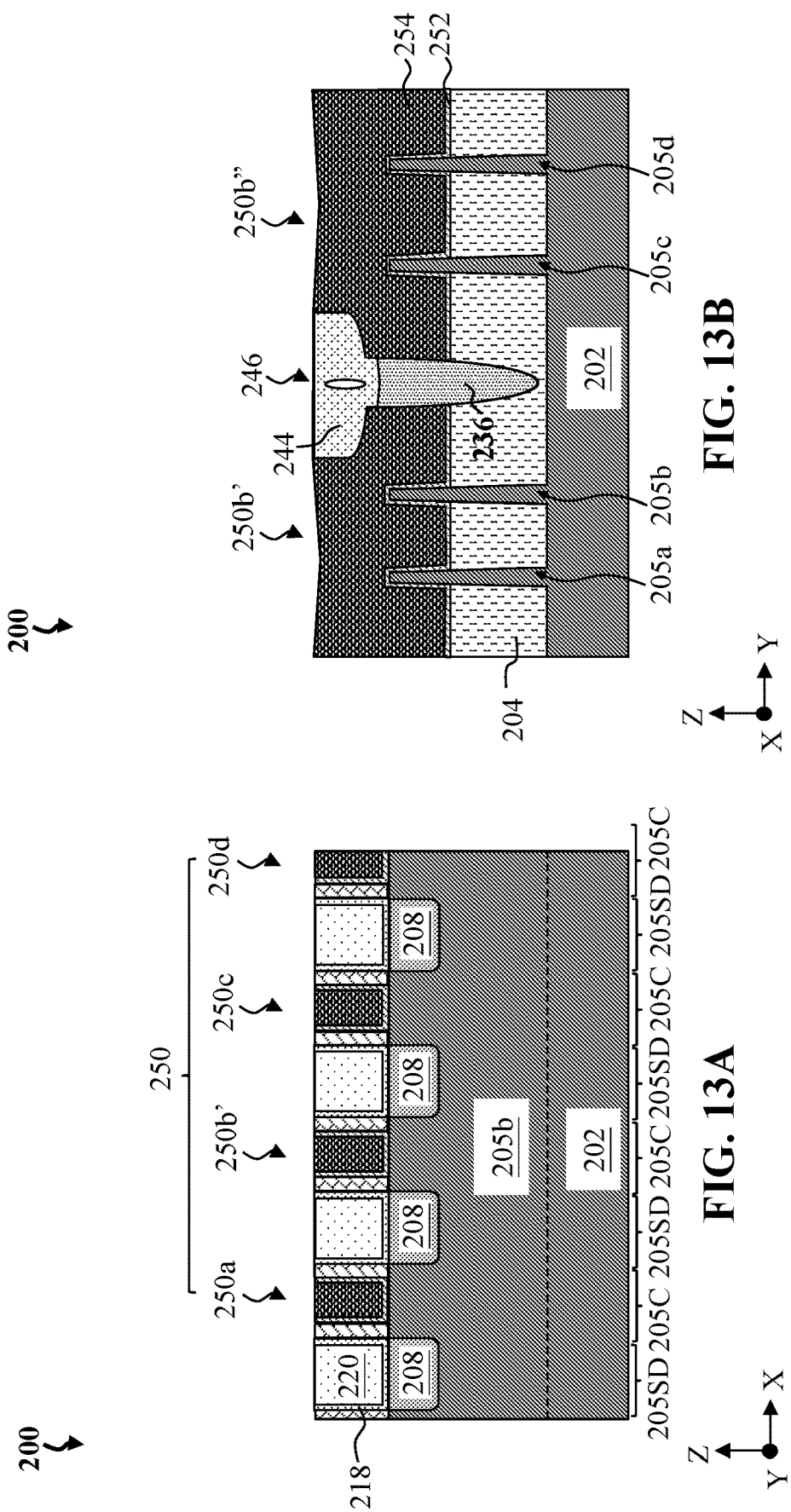

Referring to FIGS. 1 and 13A-13B, method 100 includes a block 120 where the dummy gate structures are replaced by gate stacks. After forming the gate isolation structure 246, one or more etching processes may be performed to selectively remove the dummy gate structures 210a-210d. Functional gate stacks 250a, 250b', 250b", 250c, 250d are then formed. The gate stacks 250a, 250b', 250b", 250c, 250d may be separately or collectively referred to as gate stack(s) 250. The gate stack 250 includes a gate dielectric layer and a gate electrode 254 over the gate dielectric layer. The gate dielectric layer may include an interfacial layer (not depicted) and a high-k dielectric layer 252. In some instances, the interfacial layer may be formed by thermal oxidation and may include silicon oxide. The high-k dielectric layer 252 is formed of dielectric materials having a high dielectric constant, for example, greater than a dielectric constant of silicon oxide (k≈3.9). Exemplary high-k dielectric materials for the high-k dielectric layer include hafnium oxide, titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable materials. In one embodiment, the high-k dielectric layer is formed of hafnium oxide (HfO). The gate electrode 254 may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof. After the deposition of the dielectric layer 252 and the gate electrode 254, a chemical mechanical polishing (CMP) process may be performed to remove excess materials over the gate isolation structure 246. In some embodiments, the gate electrode 254 suffers a higher CMP removal rate than the gate isolation structure 246. As a result, after the CMP process, the gate stack 250 has a concave top surface, as illustrated in FIG. 13B.

Referring to FIG. 1, method 100 includes a block 122 where further processes are performed to finish the fabrication process. Such further processes may include forming a silicide layer (not depicted) over the source/drain features 208 and a multi-layer interconnect (MLI) structure (not depicted) over the workpiece 200. The MLI may include various interconnect features, such as vias and conductive lines, disposed in dielectric layers, such as etch-stop layers and ILD layers. In some embodiments, the vias are vertical interconnect features configured to interconnect device-level contacts, such as source/drain contacts formed over the source/drain features 208 and gate contacts (not depicted) formed over the gate stacks 250.

In the above embodiments described with reference to FIGS. 1-13B, the T-shaped gate isolation structure 246 includes the first dielectric layer 236 filling the bottom portion of the trench 230 and the second dielectric layer 244 formed over the first dielectric layer 236. Each of the first dielectric layer 236 and the second dielectric layer 244 is a single-layer structure. In some embodiments, to provide different device speeds, at least one of the first dielectric layer 236 and the second dielectric layer 244 may include a multi-layer structure. In embodiments represented in FIG. 14B, the workpiece 200 includes a T-shaped gate isolation structure 246'. The gate isolation structure 246' is similar to the gate isolation structure 246, and one of the differences between the gate isolation structure 246 and the gate isolation structure 246' includes that, as depicted in FIG. 14B, instead of having the single-layer first dielectric layer 236 formed in the bottom portion of the trench 230, the gate isolation structure 246' includes a multi-layer structure 236' formed in the bottom portion of the trench 230. In the present embodiments, the multi-layer structure 236' includes an inner layer 236b and an outer layer 236a extending along sidewall and bottom surfaces of the inner layer 236b. In an example process, the formation of the multi-layer structure 236' may include conformally depositing the outer layer 236a over the workpiece 200 to partially fill the trench 230, and then depositing the inner layer 236b over the outer layer 236a to fill a remaining portion of the trench 230, and etching back the inner layer 236b and the outer layer 236a in a way similar to the etching back of the first dielectric layer 232. The term "conformally" may be used herein for case of description of a layer having substantially uniform thickness over various regions of the workpiece 200. In an embodiment, a thickness of the outer layer 236a may be between about 1 nm and about 3 nm. The outer layer 236a may be formed of a high-K dielectric material to provide satisfactory protection to the inner layer 236b in subsequent process, such as the etching process configured to selectively remove the dummy gate structures. The inner layer 236b may be formed of a low-k dielectric material or a high-k dielectric material. In embodiments where a higher device speed is preferred, the inner layer 236b may be formed of a low-k dielectric material. In an embodiment, the second dielectric layer 244 is also formed of a high-k dielectric material. Therefore, the inner layer 236b that is formed of a low-k dielectric material is wrapped around by high-k dielectric material(s). The second dielectric layer 244 and the outer layer 236a may be formed of different high-k dielectric materials or the same k dielectric material. In some embodiments, the multi-layer structure 236' may include more than two dielectric layers.

In embodiments represented in FIG. 14B, the gate isolation structure 246' includes a multi-layer structure 236' formed in the bottom portion of the trench 230. In some other implementations, the gate isolation structure 246' includes the first dielectric layer 236 formed in the bottom portion of the trench 230, and the second dielectric layer 244 may be replaced by a multi-layer structure that has a configuration similar to the multi-layer structure 236'. In some other embodiments, both the first dielectric layer 236 and the second dielectric layer 244 are replaced by a first multi-layer structure and a second multi-layer structure, respectively. The first multi-layer structure and the second multi-layer structure may be the same as or different from the multi-layer structure 236'. In the above embodiments described with reference to FIGS. 1-14B, the gate isolation structure 246/246' is formed after the formation of the dummy gate structures 210a-210d and before the formation of the functional gate stacks 250. In some other implementations, the gate isolation structure 246/246' may be formed after the formation of the functional gate stacks 250.

Figure 15:
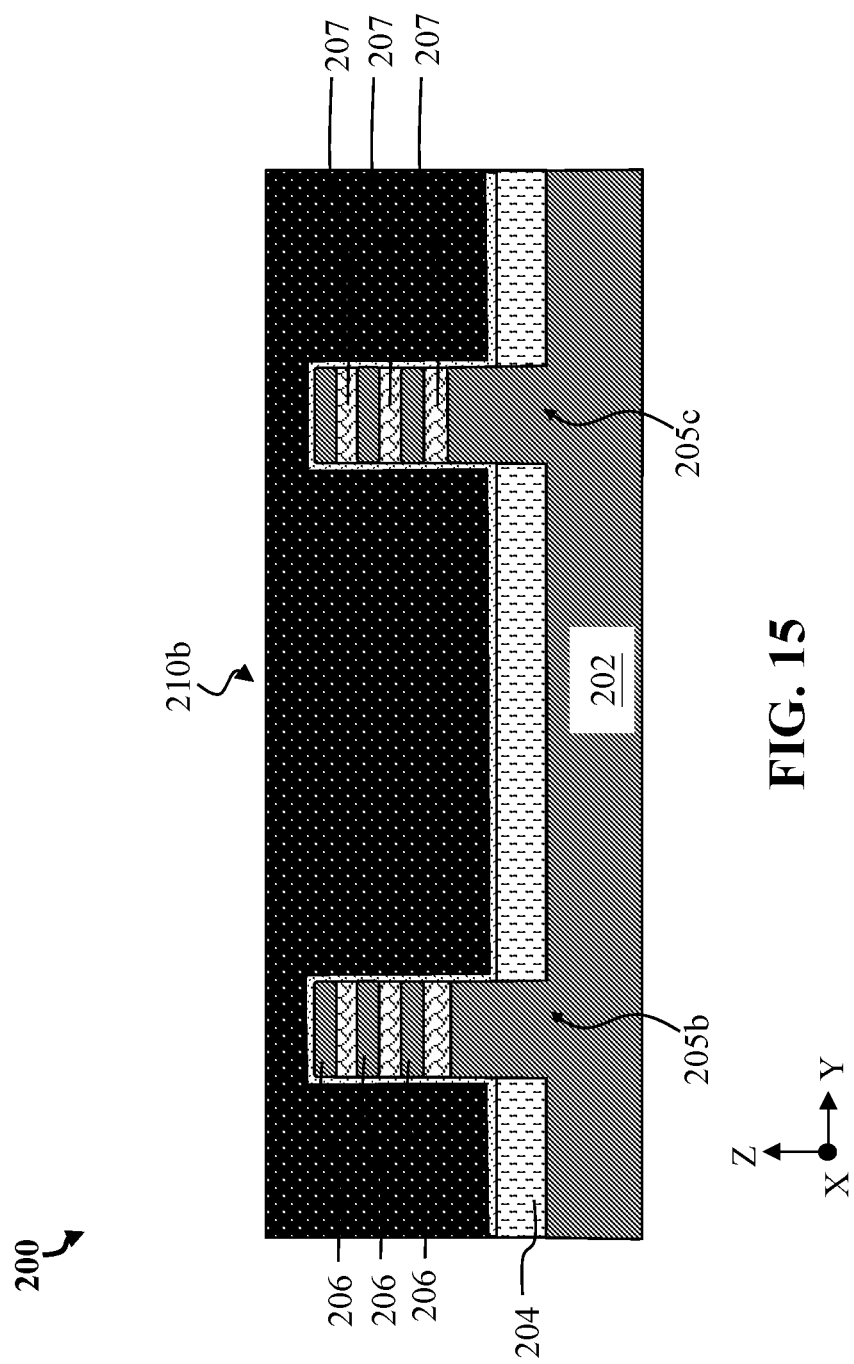
FIGS. 15, 16 and 17 illustrate fragmentary cross-sectional views of an alternative workpiece during various fabrication stages in the method of FIG. 1, according to various aspects of the present disclosure.
Figure 16:
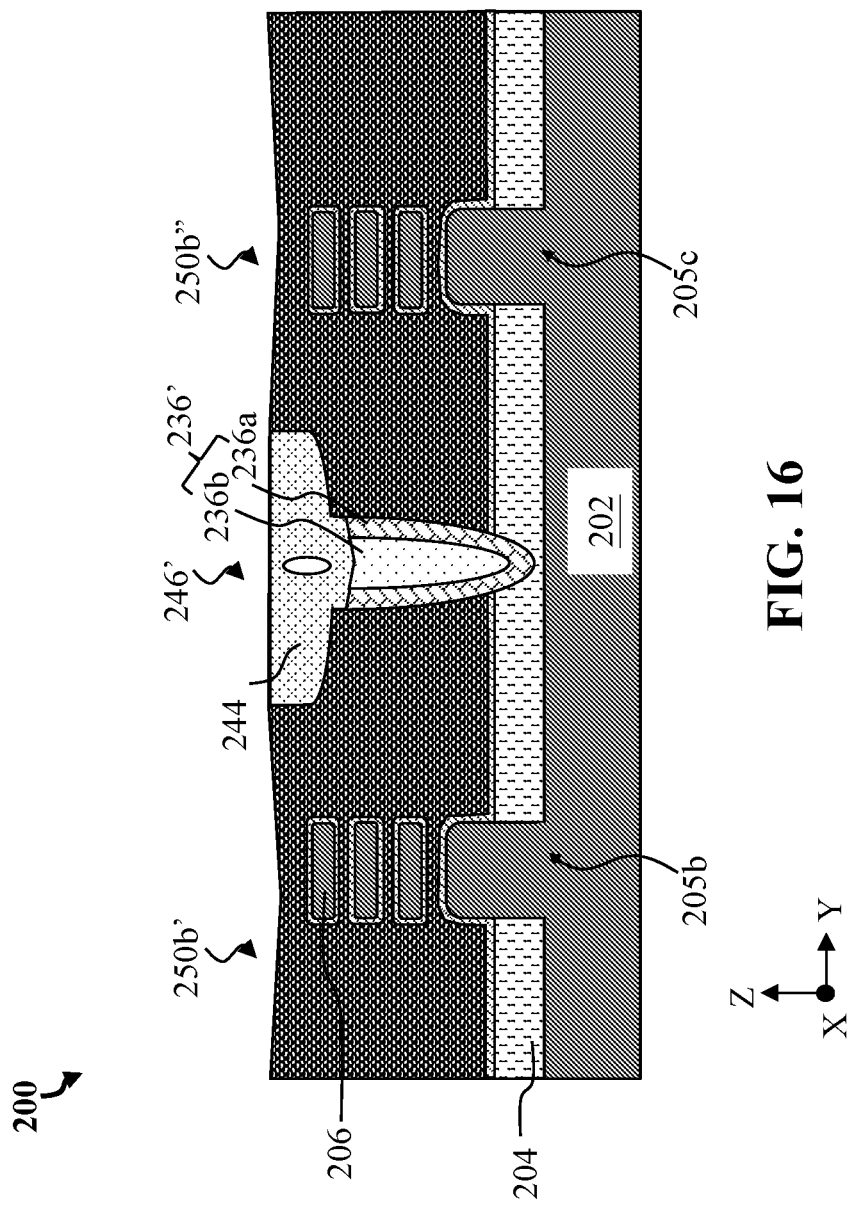
Figure 17:
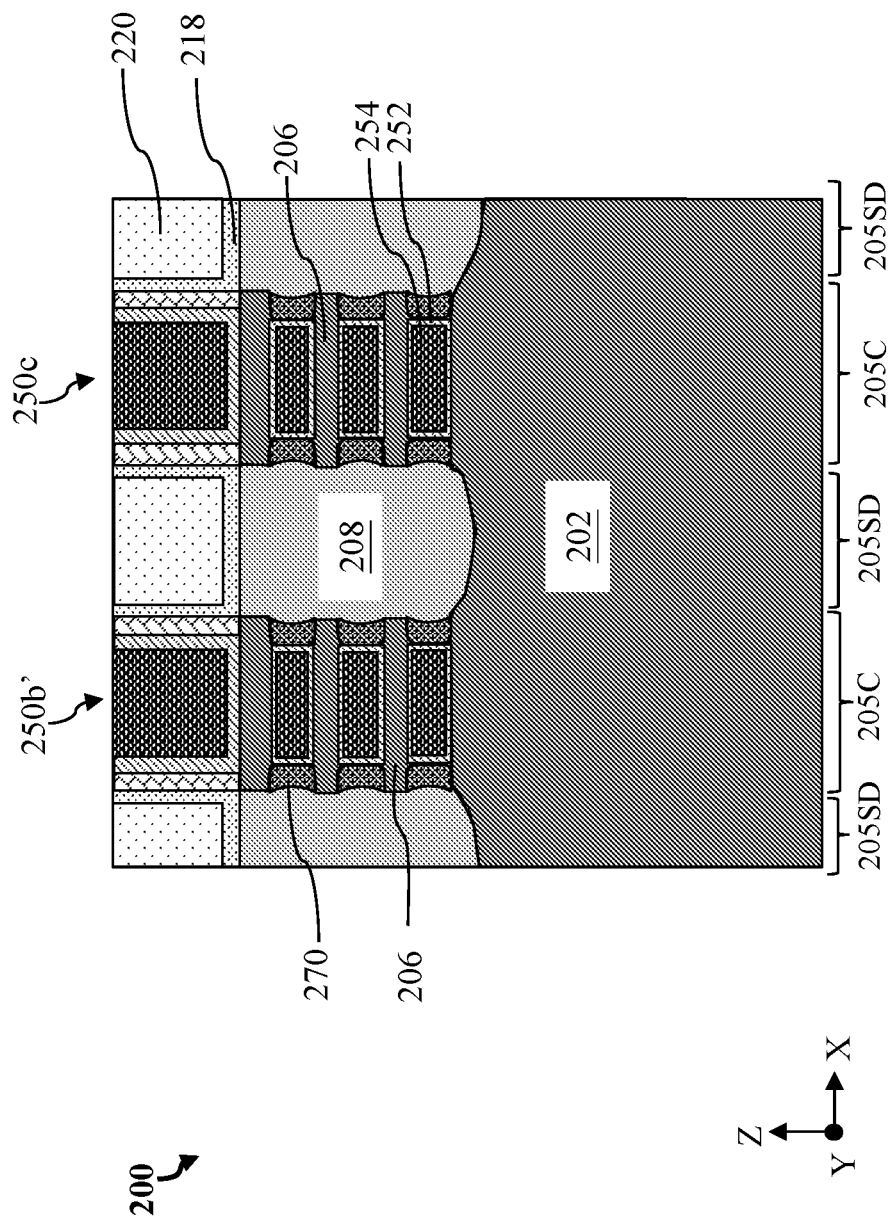

In embodiments described above with reference to FIGS. 3A-11A, 3B-11B, 13A-14A and 13B-14B, each of the fin-shaped structures 205a-205d includes a uniform semiconductor composition along the Z axis and a final structure of the workpiece 200 includes FinFETs, as depicted in FIGS. 13A-13B and 14A-14B. In an alternative embodiment, the method 100 may be applied to fabricate semiconductor structures including MBC transistors. For example, in embodiments depicted in FIGS. 15, 16 and 17, the workpiece 200 may be fabricated to form MBC transistors and the fin-shaped structures 205a-205d in the workpiece 200 depicted in FIGS. 16 and 17 may include at least one nanostructure of an MBC transistor. A cross-sectional view of the workpiece 200 depicted in FIG. 15 is similar to that of FIG. 3B, a cross-sectional view of the workpiece 200 depicted in FIG. 16 is similar to that of FIG. 14B, and a cross-sectional view of the workpiece 200 depicted in FIG. 17 is similar to that of FIG. 14A, and repeated description is omitted for reason of simplicity. One of the differences between embodiments represented in FIGS. 15-17 and FIGS. 3A-14B includes that, the fin-shaped structures 205a-205d of this alternative embodiment may be formed from patterning one or more epitaxial layers (e.g., a vertical stack of alternating channel layers 206 and sacrificial layers 207, depicted in FIG. 15) deposited over the substrate 202. The channel layers 206 and sacrificial layers 207 have different compositions. In an embodiment, the channel layers 206 include silicon, and the sacrificial layers 207 include silicon germanium. Before forming the source/drain features 208, the sacrificial layers 207 may be laterally recessed along the X direction, and the recessed sacrificial layers 207 may be capped by inner spacer features 270 (shown in FIG. 17). The operations of blocks 104-120 of method 100 in FIG. 1 may be then performed to the exemplary workpiece 200 shown in FIG. 15 to form the gate isolation structure 246' (or the gate isolation structure 246), thereby forming the workpiece 200 in FIG. 16 and FIG. 17. It is noted that, after the selectively removal of the dummy gate structures, the sacrificial layers 207 in the channel regions of fin-shaped structures 205a-205d are then selectively removed to release the channel layers 206 into suspended nanostructures 206 to form a channel region. The functional gate stack 250 is then formed over the channel region and wraps around each of the suspended nanostructures 206.

Although not intended to be limiting, one or more embodiments of the present disclosure provide many benefits to a semiconductor structure and the formation thereof. For example, the present disclosure provides a gate isolation structure, and methods of forming the same, disposed between two gate structures. The gate isolation structure is configured to have a T shape. By providing the T-shaped gate isolation structure, parasitic capacitance between the two gate structures may be advantageously reduced. Therefore, device speed may be increased and device performance may be improved. In various embodiments, the device speed may be tuned or modulated by forming the gate isolation structure with different dielectric materials. The present disclosure is compatible to various semiconductor fabrication processes, and compatible to various semiconductor structures (e.g., single-fin FinFETs, dual-fin FinFETs, transistors having nanostructures such as gate-all-around transistors).

The present disclosure provides for many different embodiments. Semiconductor structures and methods of fabrication thereof are disclosed herein. In one exemplary aspect, the present disclosure is directed to a method. The method includes receiving a workpiece including a first semiconductor fin and a second semiconductor fin over a substrate and a gate structure engaging both the first semiconductor fin and the second semiconductor fin, performing a first etching process to remove a first portion of the gate structure that is disposed between the first and second semiconductor fins to form a trench, forming a first dielectric layer in a lower portion of the trench, after the forming of the first dielectric layer, performing a second etching process to enlarge an upper portion of the trench not filled by the first dielectric layer, and forming a second dielectric layer over the first dielectric layer to substantially fill a remaining portion of the trench.

In some embodiments, the forming of the first dielectric layer in the lower portion of the trench may include depositing a first material layer over the gate structure and in the trench, and etching back the first material layer to remove portions of the first material layer formed over the gate structure and formed in the upper portion of the trench. In some embodiments, the composition of the first dielectric layer may be the same as a composition of the second dielectric layer. In some embodiments, the first dielectric layer may include a dielectric filler layer and a dielectric liner layer extending along sidewall and bottom surfaces of the dielectric filler layer. In some embodiments, the first etching process may include a dry etching process, and the second etching process comprises a wet etching process. In some embodiments, the workpiece may include an isolation feature disposed between and in direct contact with bottom portions of the first and second semiconductor fins, and the trench may extend into the isolation feature. In some embodiments, the method may also include forming a first patterned mask film over the gate structure, wherein the first patterned mask film may include a first opening exposing the first portion of the gate structure. In some embodiments, the method may also include, after the forming of the first dielectric layer, forming a second patterned mask film over the gate structure, wherein the second patterned mask film may include a second opening, the second opening spans a width greater than a width of the first opening. In some embodiments, the first dielectric layer may include silicon oxide, and the forming of the first dielectric layer may include performing a flowable chemical vapor deposition (FCVD) process. In some embodiments, the first dielectric layer may include silicon nitride, and the forming of the first dielectric layer may include performing an atomic layer deposition (ALD) process to form a first silicon nitride layer and performing a FCVD process to form a second silicon nitride layer on the first silicon nitride layer.

In another exemplary aspect, the present disclosure is directed to a method. The method includes forming a first fin-shaped active region and a second fin-shaped active region over a substrate, the first and second fin-shaped active regions extending lengthwise along a first direction, forming a gate structure over channel regions of the first and second fin-shaped active regions, the gate structure extending lengthwise along a second direction substantially perpendicular to the first direction, forming a trench to separate the gate structure into two segments, wherein, in a top view, the trench extends lengthwise along the first direction and is disposed between the first and second fin-shaped active regions, performing an etching process to enlarge an upper portion of the trench, and forming a gate isolation structure in the trench, wherein, in a cross-sectional view cut through the first and second fin-shaped active regions and the gate structure, the gate isolation structure is a T-shape structure.

In some embodiments, before the performing of the etching process, the upper portion of the trench spans a first width along the second direction, and after the performing of the etching process, the upper portion of the trench spans a second width along the second direction, the second width may be greater than the first width. In some embodiments, a ratio of the first width to the second width may be between about 0.3 and about 0.8. In some embodiments, the forming of the gate isolation structure may include, before the performing of the etching process, forming a first dielectric structure to fill a bottom portion of the trench, and after the performing of the etching process, forming a second dielectric structure over the first dielectric structure to fill a remaining portion of the trench. In some embodiments, one of the first and second dielectric structure may include a first dielectric layer extending along sidewall and bottom surfaces of a second dielectric layer, a dielectric constant of the first dielectric layer is different than a dielectric constant of the second dielectric layer. In some embodiments, the method may also include, after the forming of the gate isolation structure, replacing the two segments of the gate structure with two gate stacks, respectively, wherein each of the two gate stacks may include a high-k dielectric layer and a work function layer disposed over the high-k dielectric layer.

In yet another exemplary aspect, the present disclosure is directed to a semiconductor structure. The semiconductor structure includes a first transistor comprising a first gate structure over a first channel region and first source/drain features coupled to the first channel region and disposed adjacent to the first gate structure, a second transistor comprising a second gate structure over a second channel region and second source/drain features coupled to the second channel region and disposed adjacent to the second gate structure, and a gate isolation structure configured to provide isolation between and in direct contact with the first gate structure and the second gate structure, in a cross-sectional view cut through the first and second gate structures and the first and second channel regions, a shape of the gate isolation structure includes a T shape.

In some embodiments, the gate isolation structure may include a bottom portion formed of a first dielectric material and an upper portion formed of a second dielectric material, a composition of the first dielectric material may be different than a composition of the second dielectric material. A bottom surface of the upper portion of the gate isolation structure may be above a top surface of the first channel region. A top surface of the gate isolation structure may span a width less than a distance between the first and second channel regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a first semiconductor fin and a second semiconductor fin over a substrate, and
      a gate structure engaging both the first semiconductor fin and the second semiconductor fin;
   performing a first etching process to remove a first portion of the gate structure that is disposed between the first and second semiconductor fins to form a trench;
   forming a first dielectric layer in a lower portion of the trench;
   after the forming of the first dielectric layer, performing a second etching process to enlarge an upper portion of the trench not filled by the first dielectric layer; and
   forming a second dielectric layer over the first dielectric layer to substantially fill a remaining portion of the trench.

2. The method of claim 1, wherein the forming of the first dielectric layer in the lower portion of the trench comprises:
   depositing a first material layer over the gate structure and in the trench; and
   etching back the first material layer to remove portions of the first material layer formed over the gate structure and formed in the upper portion of the trench.

3. The method of claim 1, wherein a composition of the first dielectric layer is the same as a composition of the second dielectric layer.

4. The method of claim 1, wherein the first dielectric layer comprises:
   a dielectric filler layer; and
   a dielectric liner layer extending along sidewall and bottom surfaces of the dielectric filler layer.

5. The method of claim 1, wherein the first etching process comprises a dry etching process, and the second etching process comprises a wet etching process.

6. The method of claim 1, wherein the workpiece further comprises an isolation feature disposed between and in direct contact with bottom portions of the first and second semiconductor fins, and wherein the trench extends into the isolation feature.

7. The method of claim 1, further comprising:
   forming a first patterned mask film over the gate structure, wherein the first patterned mask film comprises a first opening exposing the first portion of the gate structure.

8. The method of claim 7, further comprising:
   after the forming of the first dielectric layer, forming a second patterned mask film over the gate structure, wherein the second patterned mask film comprises a second opening, the second opening spans a width greater than a width of the first opening.

9. The method of claim 1, wherein the first dielectric layer comprises silicon oxide, and the forming of the first dielectric layer comprises performing a flowable chemical vapor deposition (FCVD) process.

10. The method of claim 1, wherein the first dielectric layer comprises silicon nitride, and the forming of the first dielectric layer comprises performing an atomic layer deposition (ALD) process to form a first silicon nitride layer and performing a FCVD process to form a second silicon nitride layer on the first silicon nitride layer.

11. A method, comprising:
   forming a first fin-shaped active region and a second fin-shaped active region over a substrate, the first and second fin-shaped active regions extending lengthwise along a first direction;
   forming a gate structure over channel regions of the first and second fin-shaped active regions, the gate structure extending lengthwise along a second direction substantially perpendicular to the first direction;
   forming a trench to separate the gate structure into two segments, wherein, in a top view, the trench extends lengthwise along the first direction and is disposed between the first and second fin-shaped active regions;
   performing an etching process to enlarge an upper portion of the trench; and
   forming a gate isolation structure in the trench, wherein, in a cross-sectional view cut through the first and second fin-shaped active regions and the gate structure, the gate isolation structure is a T-shape structure.

12. The method of claim 11, wherein, before the performing of the etching process, the upper portion of the trench spans a first width along the second direction, and after the performing of the etching process, the upper portion of the trench spans a second width along the second direction, the second width is greater than the first width.

13. The method of claim 12, wherein a ratio of the first width to the second width is between about 0.3 and about 0.8.

14. The method of claim 12, wherein the forming of the gate isolation structure comprises:
   before the performing of the etching process, forming a first dielectric structure to fill a bottom portion of the trench; and
   after the performing of the etching process, forming a second dielectric structure over the first dielectric structure to fill a remaining portion of the trench.

15. The method of claim 14, wherein one of the first and second dielectric structure comprises a first dielectric layer extending along sidewall and bottom surfaces of a second dielectric layer, a dielectric constant of the first dielectric layer is different than a dielectric constant of the second dielectric layer.

16. The method of claim 11, further comprising:
   after the forming of the gate isolation structure, replacing the two segments of the gate structure with two gate stacks, respectively, wherein each of the two gate stacks comprises a high-k dielectric layer and a work function layer disposed over the high-k dielectric layer.

17. A semiconductor structure, comprising:
   a first transistor comprising:
      a first gate structure over a first channel region, and
      first source/drain features coupled to the first channel region and disposed adjacent to the first gate structure;
   a second transistor comprising:
      a second gate structure over a second channel region, and
      second source/drain features coupled to the second channel region and disposed adjacent to the second gate structure; and
   a gate isolation structure configured to provide isolation between and in direct contact with the first gate structure and the second gate structure,
   wherein, in a cross-sectional view cut through the first and second gate structures and the first and second channel regions, a shape of the gate isolation structure comprises a T shape.

18. The semiconductor structure of claim 17, wherein the gate isolation structure comprises a bottom portion formed of a first dielectric material and an upper portion formed of a second dielectric material, a composition of the first dielectric material is different than a composition of the second dielectric material.

19. The semiconductor structure of claim 18, wherein a bottom surface of the upper portion of the gate isolation structure is above a top surface of the first channel region.

20. The semiconductor structure of claim 18, wherein a top surface of the gate isolation structure spans a width less than a distance between the first and second channel regions.

* * * * *